United States Patent
Lee et al.

(10) Patent No.: US 7,582,924 B2
(45) Date of Patent: Sep. 1, 2009

(54) SEMICONDUCTOR DEVICES HAVING POLYMETAL GATE ELECTRODES

(75) Inventors: Byung-Hak Lee, Suwon-si (KR);
Dong-Chan Lim, Yongin-si (KR);
Gil-Heyun Choi, Yongin-si (KR);
Hee-Sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 417 days.

(21) Appl. No.: 11/400,605

(22) Filed: Apr. 7, 2006

(65) Prior Publication Data

US 2006/0244084 A1    Nov. 2, 2006

(30) Foreign Application Priority Data

Apr. 27, 2005    (KR) .................... 10-2005-0034916

(51) Int. Cl.
*H01L 27/108* (2006.01)

(52) U.S. Cl. .............. 257/296; 257/301; 257/302; 257/316; 257/388; 257/E21.209; 438/261; 438/585

(58) Field of Classification Search .......... 257/E21.2, 257/E21.209, E29.154, E29.157, 296, 301, 257/302, 316, 388
See application file for complete search history.

(56) References Cited

U.S. PATENT DOCUMENTS

| 2001/0001720 | A1* | 5/2001 | Clampitt et al. | ............. 438/257 |
| 2005/0212036 | A1* | 9/2005 | Tanaka et al. | ............... 257/316 |

FOREIGN PATENT DOCUMENTS

| JP | 2001-100760 | 4/2001 |
| KR | 10-2000-0003918 | 1/2000 |
| KR | 10-2004-0008649 | 1/2004 |

* cited by examiner

*Primary Examiner*—Zandra Smith
*Assistant Examiner*—Tsz K Chiu
(74) *Attorney, Agent, or Firm*—Myers Bigel Sibley & Sajovec

(57) ABSTRACT

Semiconductor devices and methods of fabricating the same are provided. A gate insulating film is provided on a semiconductor substrate. A polymetal gate electrode is provided on the gate insulating film. The polymetal gate electrode includes a conductive polysilicon film on the gate insulating film, a first metal silicide film on the conductive polysilicon film, a barrier film on the first metal silicide film, and a metal film on the barrier film. The barrier film includes a titanium nitride (TiN) film on the first metal silicide film and a buffer layer between the TiN film and the metal film.

7 Claims, 6 Drawing Sheets

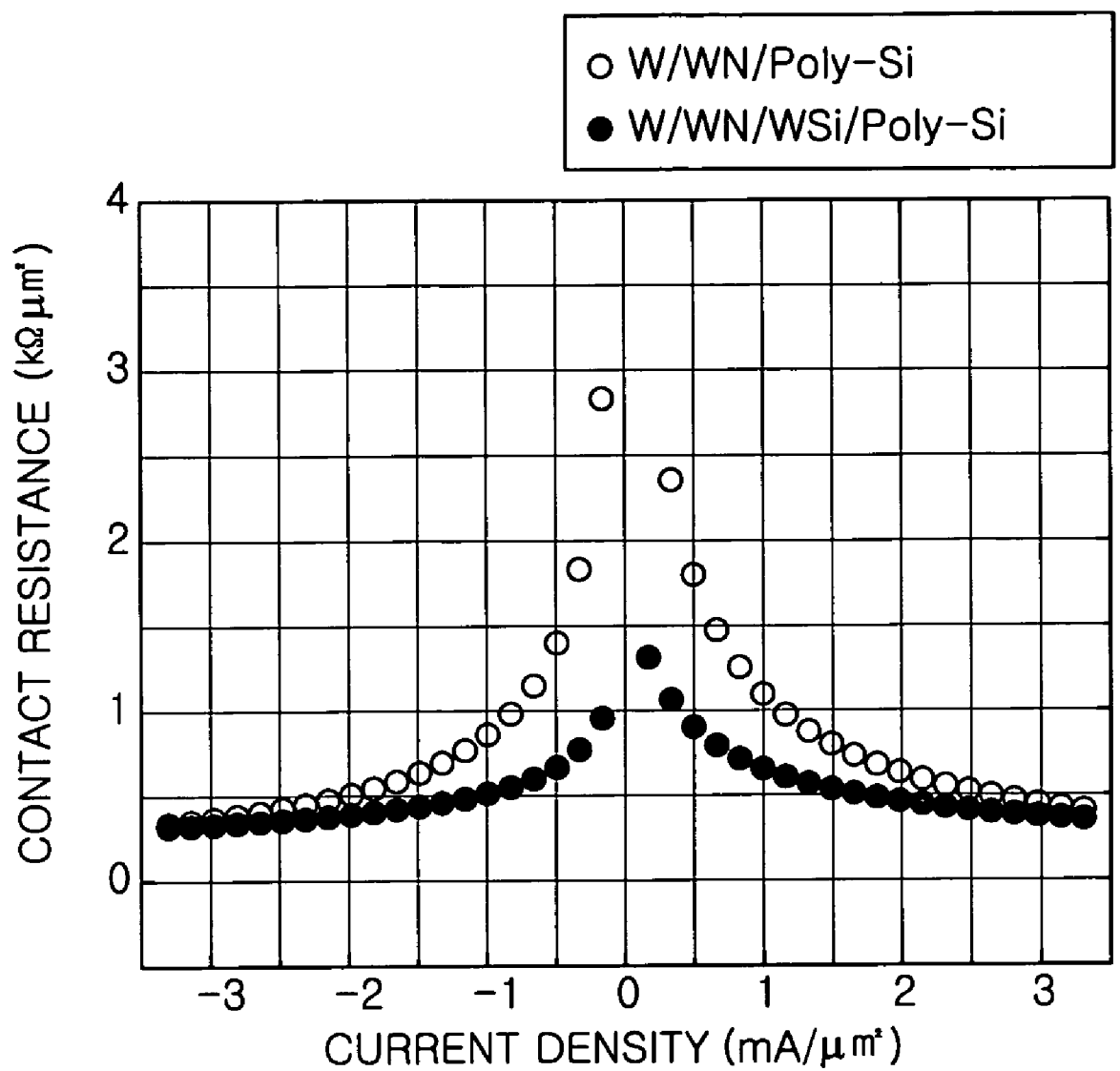

SEMICONDUCTOR DEVICES HAVING POLYMETAL GATE ELECTRODES

CLAIM OF PRIORITY

This application is related to and claims priority from Korean Patent Application No. 10-2005-0034916, filed on Apr. 27, 2005, in the Korean Intellectual Property Office, the disclosure of which is hereby incorporated herein by reference as if set forth in its entirety.

FIELD OF THE INVENTION

The present invention relates to semiconductor devices and related methods, and more particularly, to semiconductor devices and methods of fabricating semiconductor devices including polymetal gate electrodes.

BACKGROUND OF THE INVENTION

As semiconductor devices are now manufactured using 100 nm technology or less, resistance in wiring layers, such as word lines that constitute a gate electrode, has significantly increased. This increase in resistance may result in, for example, signal delays in the wiring layers. Accordingly, to address the problem of increased resistance in the wiring layers, a polymetal gate electrode including a conductive polysilicon layer, a barrier film, and a metal film sequentially formed on a semiconductor substrate has been suggested.

Such a polymetal gate electrode structures is discussed in, for example, U.S. Pat. No. 6,774,442. As discussed therein, the barrier film of the polymetal gate mainly includes tungsten nitride (WN) or tungsten silicon nitride (WSiN). When the barrier film includes Wn or WSiN, the word lines may have a low resistance, but may also have low thermal stability. Therefore, the barrier film may be partially damaged in a selective oxidation process performed after the word lines have been patterned. The selective oxidation process may restore the word lines damaged during patterning by annealing the word lines at a temperature of at least about 800° C. Thus, metal silicide may be generated from a reaction between the silicon (Si) of the polysilicon layer and a metal of the metal film.

Referring now to FIGS. 1A and 1B, scanning electron microscope (SEM) images illustrating results of annealing a conventional polymetal structure having a barrier film formed of WN will be discussed. In particular, FIG. 1A is a SEM image of a cross-section of a conventional polymetal structure. As illustrated therein, the structure includes a gate oxide film (Gox) on a Si substrate, a polysilicon layer (poly-Si) on the gate oxide film, a WN barrier film on the polysilicon layer and a W film on the WN layer. The WN film may have a thickness of about 50 Å and the W film may have a thickness of about 400 Å.

Referring now to FIG. 1B, a SEM image of a cross section of the conventional polymetal structure of FIG. 1A after having been annealed will be discussed. In particular, the polymetal structure of FIG. 1A was annealed at a temperature of about 850° C. for about 40 minutes to obtain the structure illustrated in FIG. 1B. As illustrated in FIG. 1B, the WN film between the polysilicon layer and the W film is decomposed into W and N, and has been partially damaged by the annealing process. Furthermore, the majority of the polysilicon layer and the W film have been silicided.

SUMMARY OF THE INVENTION

Some embodiments of the present invention provide semiconductor devices and methods of fabricating the same. A gate insulating film is provided on a semiconductor substrate. A polymetal gate electrode is provided on the gate insulating film. The polymetal gate electrode includes a conductive polysilicon film on the gate insulating film, a first metal silicide film on the conductive polysilicon film, a barrier film on the first metal silicide film, and a metal film on the barrier film. The barrier film includes a titanium nitride (TiN) film on the first metal silicide film and a buffer layer between the TiN film and the metal film.

In further embodiments of the present invention, the first metal silicide film may include tungsten (W) silicide, molybdenum (Mo) silicide, titanium (Ti) silicide, tantalum (Ta) silicide, Hafnium (Hf) silicide or cobalt (Co) silicide. The buffer layer may include one or more of titanium (Ti), tantalum (Ta), zirconium (Zr), hafnium (Hf) and/or silicon (Si).

In still further embodiments of the present invention, the buffer layer may include an amorphous second metal silicide film. The second metal silicide film may include tungsten (W) silicide, molybdenum (Mo) silicide, titanium (Ti) silicide, tantalum (Ta) silicide, Hafnium (Hf) silicide or cobalt (Co) silicide.

In some embodiments of the present invention, the barrier film may include the TiN film and a Ti film. In other embodiments of the present invention, the barrier film may include the TiN film and an amorphous tungsten (W) silicide film. The metal film may include tungsten (W) or molybdenum (Mo).

BRIEF DESCRIPTION OF THE DRAWINGS

FIG. 7 is a graph illustrating variations of contact resistance between a metal film and a polysilicon film in a polymetal gate structure according to some embodiments of the present invention.

DETAILED DESCRIPTION OF EMBODIMENTS OF THE PRESENT INVENTION

Figure 1A:
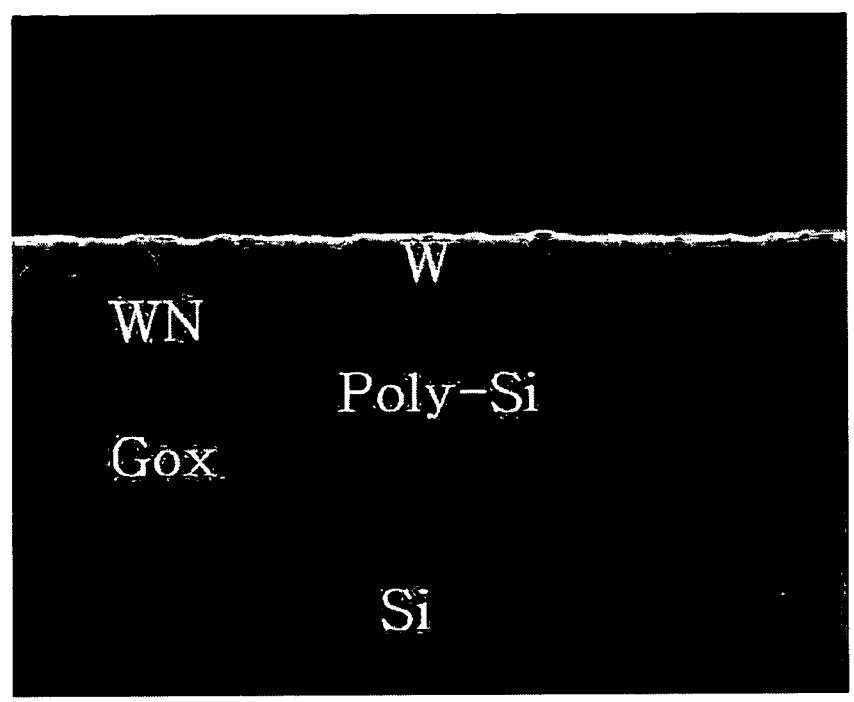
FIGS. 1A and 1B are scanning electron microscope (SEM) images of cross sections of conventional polymetal structures having a barrier film formed of WN.
Figure 1B:
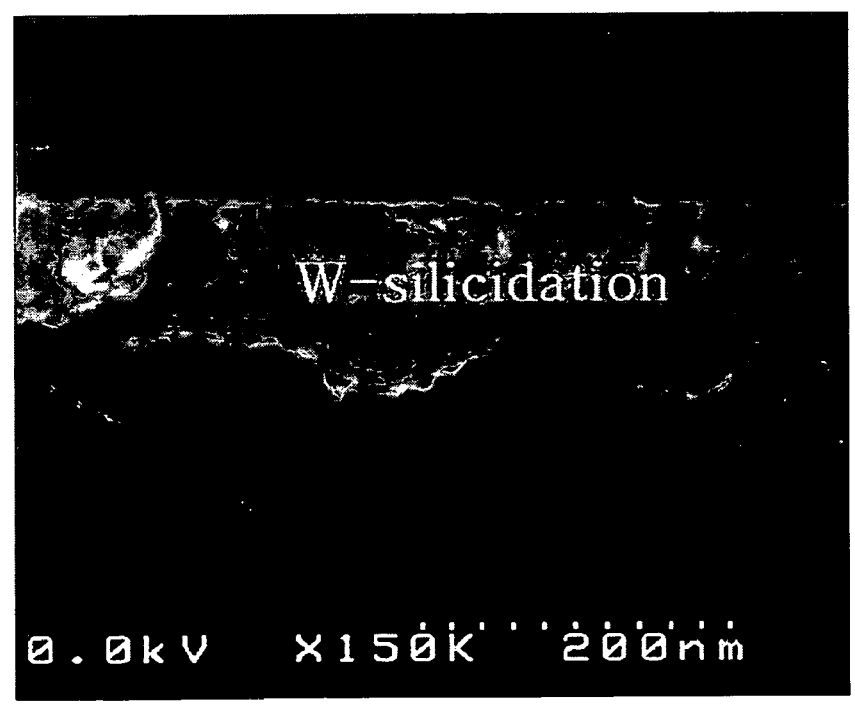

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
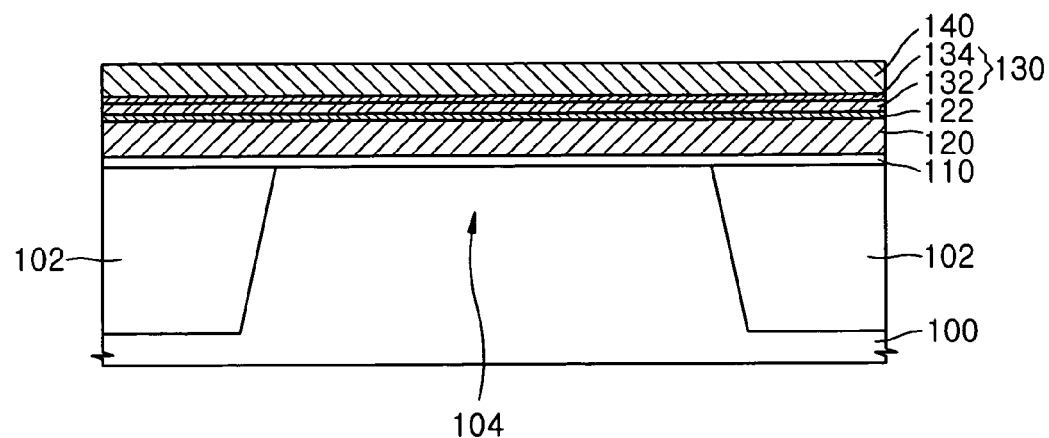
FIGS. 2A through 2D are cross sections illustrating processing steps in the fabrication of semiconductor devices according to some embodiments of the present invention.

Referring first to FIGS. 2A through 2D, cross sections illustrating processing steps in the fabrication of semiconductor devices according to some embodiments of the present invention will be discussed. As illustrated in FIG. 2A, an active region 104 is defined on a semiconductor substrate 100 by isolation regions 102 formed on the semiconductor substrate 100. The isolation regions 102 may be formed using, for example, a shallow trench isolation (STI) method.

A gate insulating film 110 is formed on the semiconductor substrate 100. The gate insulating film 110 may include, for example, an oxide film having a thickness of about 50 Å. A conductive polysilicon film 120 may be formed on the gate insulating film 110 and a first metal silicide film 122 may be formed on the conductive polysilicon film 120. The conductive polysilicon film 120 may have a thickness from about 500 to about 1000 Å. The first metal silicide film 122 may have a thickness of about 50 Å. The first metal silicide film 122 may secure an ohmic contact in a wiring structure to be formed by a later process discussed herein. The first metal silicide film 122 may include, for example, a material silicide film, such as a W silicide film, a molybdenum (Mo) silicide film, a Ti silicide film, a tantalum (Ta) silicide film, a hafnium (Hf) silicide film, a cobalt (Co) silicide film or the like. The first metal silicide film 122 may have an atomic ratio (Si/M) of silicon Si to metal M of from about 2.0 to about 10.0.

A barrier film 130 is formed on the first metal silicide film 122. The barrier film 130 includes a TiN film 132 and a buffer layer 134. The thicknesses of the TiN film 132 and the buffer layer 134 may vary according to installation dimensions of wirings to be formed in subsequent processes. For example, the TiN film 132 may have a thickness of from about 30 to about 300 Å and the buffer layer 134 may have a thickness of from about 10 to about 200 Å. The TiN film 132 and the buffer layer 134 can be formed by, for example, physical vapor deposition (PVD), chemical vapor deposition (CVD), atomic layer deposition (ALD), or the like.

The buffer layer 134 may include one or more materials selected from the group consisting of Ti, Ta, zirconium (Zr), Hf, and Si. Furthermore, the buffer layer 134 may include an amorphous second metal silicide film, such as a W silicide film, a Mo silicide film, a Ti silicide film, a Ta silicide film, a Hf silicide film, a Co silicide film or the like.

A metal film 140 is formed on the barrier film 130. The metal film 140 may include, for example, W or Mo. The TiN film 132 that constitutes the barrier film 130 may include relatively small metal grains and may have a columnar, i.e., tall cylindrical, structure. Accordingly, when the metal film 140 is formed on the TiN film 132, the size of metal grains of the metal film 140 may be reduced, since the small grain sizes and the columnar structure of the TiN film 132 may limit the growth of the metal grains of the metal film 140. The small grains of the metal film 140 can cause an increase in sheet resistance of the metal film 140. According to some embodiments of the present invention, to reduce the likelihood that the sheet resistance will increase, the barrier film 130 includes the TiN film 132 and the buffer layer 134 on the TiN film 132 as illustrated in FIG. 2A. Accordingly, the metal film 140 is formed on the buffer layer 134. In embodiments of the present invention illustrated in FIG. 2A, the growth of the metal film 140 may not be limited by the buffer layer 134, which may thereby reduce the sheet resistance of the metal film 140.

Figure 2B:
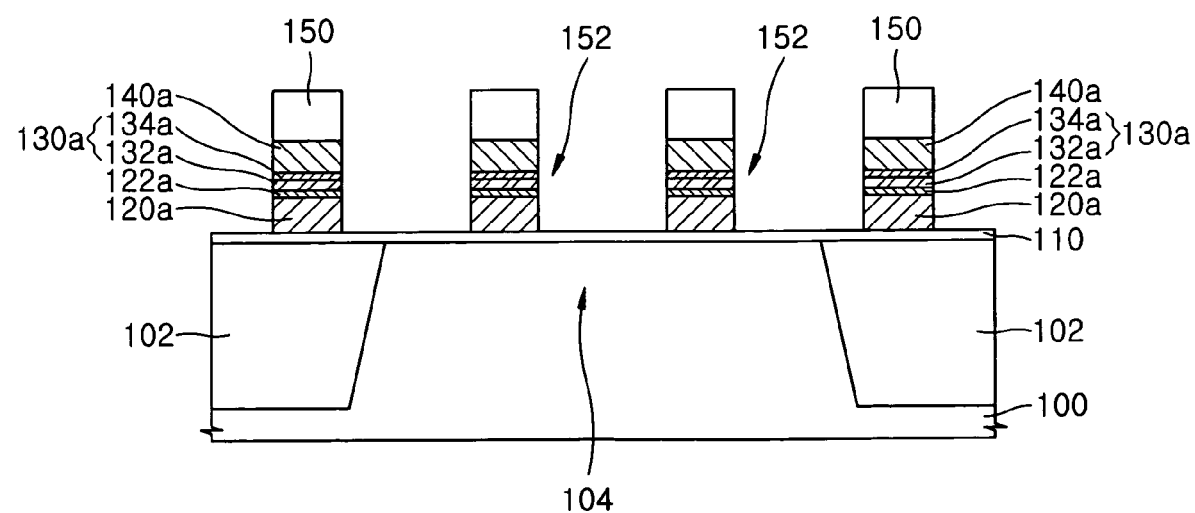

As illustrated in FIG. 2B, a gate electrode 152 includes a conductive polysilicon film pattern 120a, a first metal silicide film pattern 122a, a barrier film pattern 130a, and a metal film pattern 140a sequentially stacked on the gate insulating film 110. The gate electrode 152 is formed by, for example, patterning the conductive polysilicon film 120, the first metal silicide film 122, the barrier film 130, and the metal film 140 by an anisotropic dry etching process using an insulating film pattern 150, such as a nitride film pattern, as a mask. The barrier film pattern 130a has a stacking structure in which a TiN film pattern 132a and a buffer layer pattern 134a are stacked.

Figure 2C:
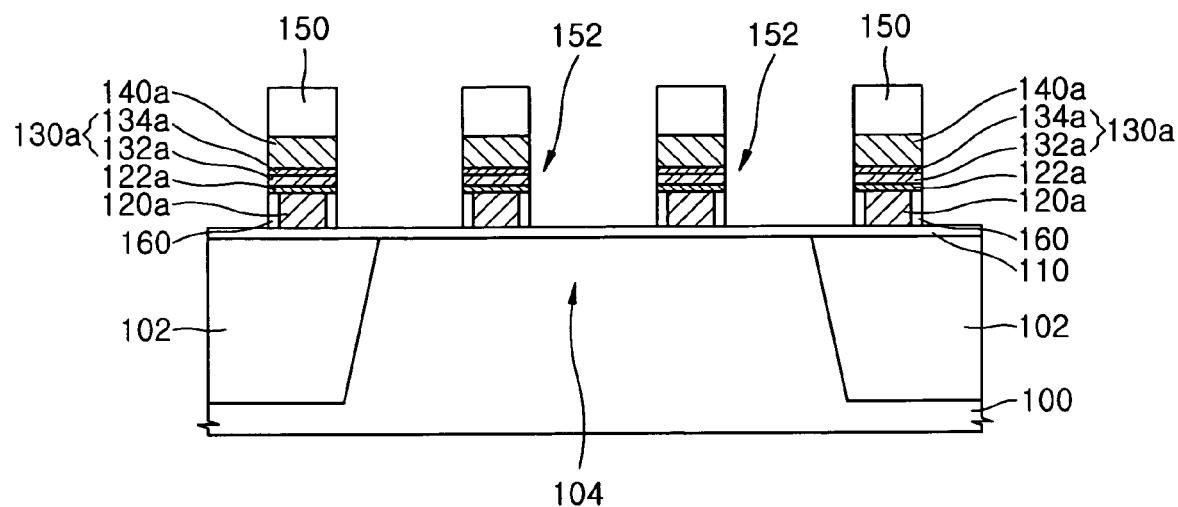

Referring now to FIG. 2C, a selective oxidation process for restoring the gate insulating film 110 that may have been damaged during the etching process for forming the gate electrode 152 is performed. The annealing portion of the selective oxidation process can be performed at a temperature of about 700 to about 1100° C. Annealing causes oxide films 160 to form on sidewalls of the conductive polysilicon film pattern 120a and a surface of the active region 104 of the semiconductor substrate 100 is oxidized.

Figure 2D:
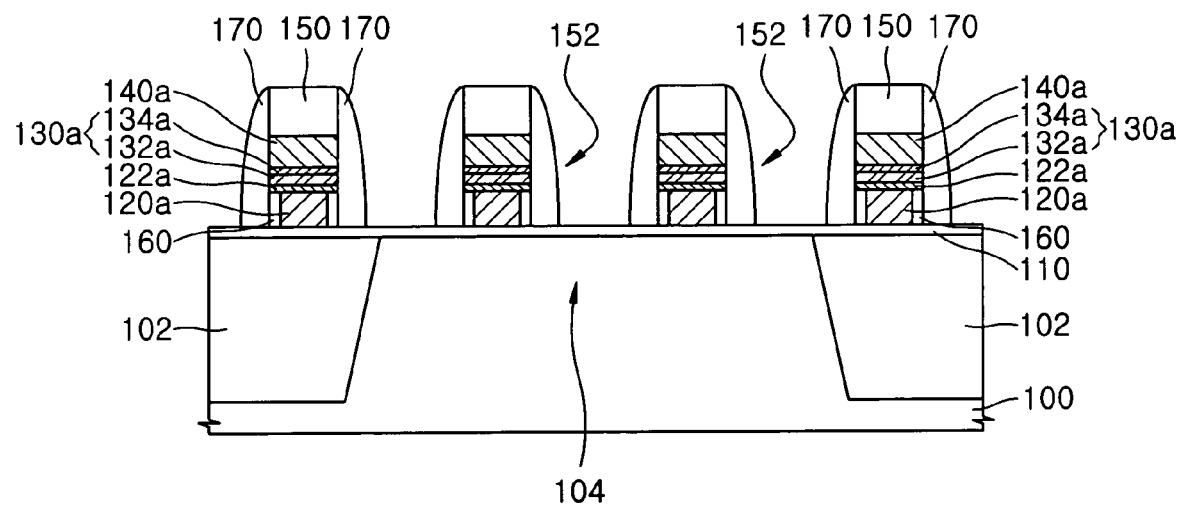

Referring now to FIG. 2D, an extension region (not shown) is formed in the semiconductor substrate 100 by implanting ions having a low doping concentration, such as $N^-$ or $P^-$ type ions, into the semiconductor substrate 100. The gate electrodes 152 and the insulating film patterns 150 provided on the gate electrodes 152 are used as ion implanting masks. Insulating spacers 170 are formed on sidewalls of the gate electrodes 152 and the insulating film patterns 150. The insulating spacers 170 may include, for example, a silicon nitride film. Source and drain regions (not shown) are formed in the active region 104 of the semiconductor substrate 100 by, for example, implanting ions having a high doping concentration, such as $N^+$ type or $P^+$ type ions, into the semiconductor substrate 100. The insulating film patterns 150 and the insulating spacers 170 may be used as ion implantation masks.

As used herein, "$N^+$" or "$P^+$" refer to regions that are defined by higher doping concentrations than are present in adjacent or other regions of the same or another layer or substrate. Similarly, "$N^-$" or "$P^-$" refer to regions that are defined by lower doping concentrations than are present in adjacent or other regions of the same or another layer or substrate.

Figure 3:
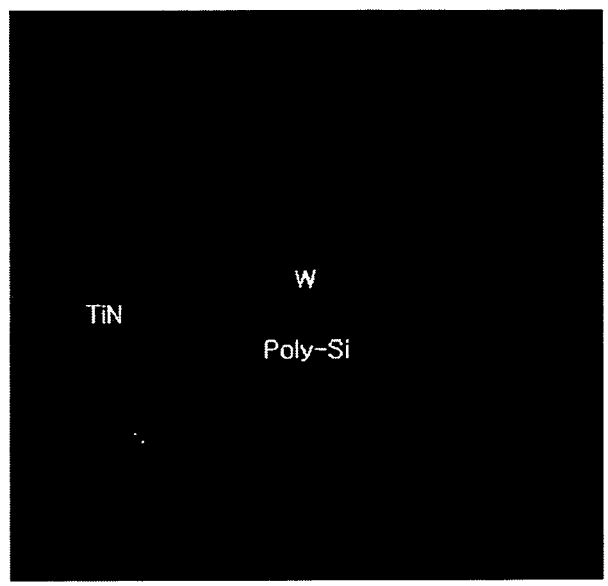
FIG. 3 is an SEM image illustrating the thermal stability of a titanium nitride (TiN) film included in a barrier film of a gate electrode of semiconductor devices according to some embodiments of the present invention.

Referring now to FIG. 3, an SEM image illustrating the thermal stability of a TiN film included in a barrier film of a gate electrode of semiconductor devices according to some embodiments of the present invention will be discussed. A cross section resulting from annealing a stacking structure at a temperature of about 850° C. for about 40 minutes is illustrated in FIG. 3. The stacking structure of FIG. 3 includes a gate oxide film (Gox) on a Si substrate, a polysilicon layer (poly-Si) on the gate oxide film, a TiN barrier film on the polysilicon layer and a W film on the TiN barrier film. Thus, a TiN film is used as the barrier film in accordance with some embodiments of the present invention. As illustrated in FIG. 3, when the TiN film is used as the barrier film, the W film has a uniform thickness since the reaction between polysilicon film poly-Si and W may be limited. Accordingly, TiN film has high thermal stability and maintains the characteristics of the barrier even though it is annealed at a high temperature.

In the polymetal gate structure, when the TiN film is used as the barrier film to secure the thermal stability of the barrier film and when a metal film, such as a W film, is formed on the TiN film using, for example, a PVD method, the grain size of the W film may be reduced. Accordingly, resistance of wiring lines may be increased by at least twice as much as the resistance when the WN barrier film is used.

Figure 4:
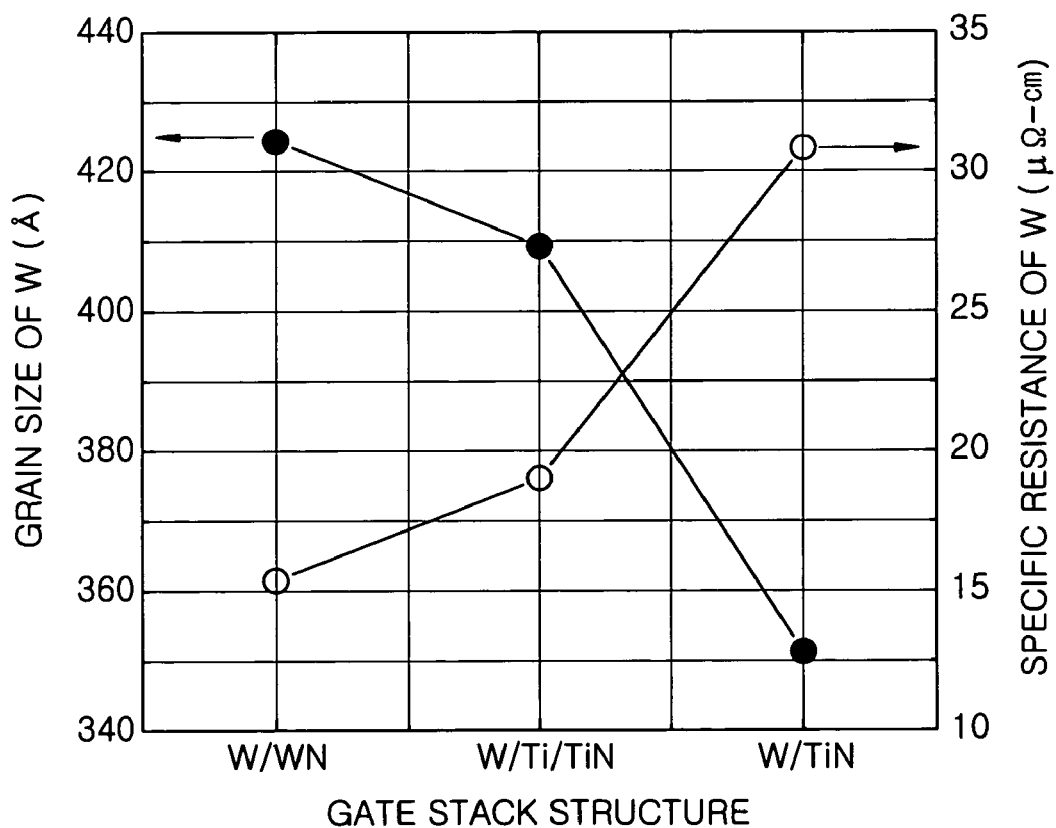
FIG. 4 is a graph illustrating grain sizes vs. specific resistance in a tungsten (W) film of gate electrodes according some embodiments of the present invention.

Referring now to FIG. 4, a graph illustrating the measurement results of grain size vs. specific resistance in a W film of a gate electrode will be discussed. To measure the grain size and specific resistance illustrated in FIG. 4, a polysilicon film (poly-Si), a W silicide film, a barrier film, and a W film are sequentially formed on the gate insulating film remote from the semiconductor substrate. The grain size and specific resistance of the W film are measured in each of the following cases: when a WN film is formed as the barrier film indicated on the graph as "W/WN"; when a TiN film and a Ti film are sequentially formed away from the semiconductor substrate as the barrier film indicated on the graph as "W/Ti/TiN"; and when the TiN film is formed as the barrier film indicated on the graph as "W/TiN".

As illustrated in the graph of FIG. 4, when the Ti film is formed on the TiN film as the barrier film and the W film as a metal film is formed on the Ti film, the grain size of W deposited on the Ti film may increase. Therefore, the specific resistance of the W film may be reduced to from about 15 to about 20 $\mu\Omega$-cm, which is the specific resistance level of W in the W/Wn structure.

Figure 5:
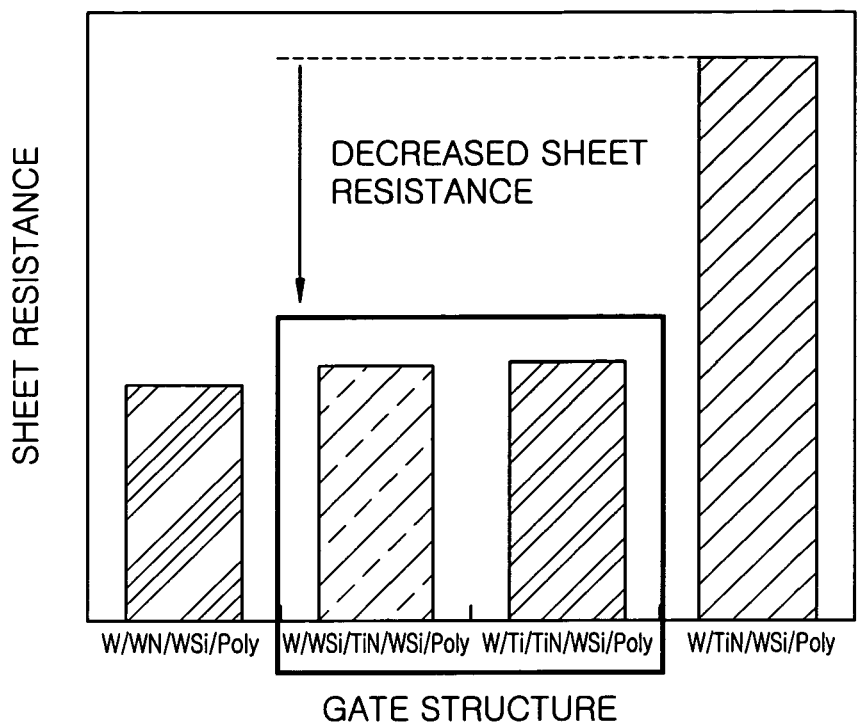
FIG. 5 is a graph illustrating sheet resistance in a W film of gate electrodes according some embodiments of the present invention.

Referring now to FIG. 5, a bar graph illustrating sheet resistances in a W film of a gate electrode according to materials of a barrier film inserted between a polysilicon film and a W film in a polymetal gate structure having the W film on the conductive polysilicon film in accordance with some embodiments of the present invention will be discussed. To measure the sheet resistance illustrated in FIG. 5, a polysilicon film, a W silicide film, a barrier film, and a W film are sequentially formed on a gate insulating film on the semiconductor substrate. The sheet resistances (Rs) of the W film are measured in each of the following cases: when a WN is formed as the barrier film indicated on the graph as "W/WN/WSi/Poly"; when a TiN film and a W silicide film are sequentially formed on the semiconductor substrate as the barrier film indicated on the graph as "W/WSi/TiN/WSi/Poly"; when a TiN film and a Ti film are sequentially formed on the semiconductor substrate as the barrier film indicated on the graph as "W/Ti/TiN/WSi/Poly"; and when a TiN film is formed as the barrier film indicated on the graph as "W/TiN/WSi/Poly".

As illustrated in FIG. 5, when the TiN film is only used as the barrier film, the sheet resistance Rs of the W film may be increased by at least twice as much as the sheet resistance when the WN film is used as the barrier film. This may be due to the fact when the TiN film is only used as the barrier film, the grain size of W directly deposited on the TiN film is reduced since the grain size of the W is effected by the grain size of TiN.

However, when a stacking structure of the TiN film and the W silicide film or a stacking structure of the TiN film and the Ti film is used as the barrier film in accordance with some embodiments of the present invention, the sheet resistance Rs of the W film may be reduced to approximately the same value as the sheet resistance when the WN film is used as the barrier film. This may be due to the fact that the grain size of the W film is increased since the W film is formed on an amorphous film, that is, the Ti film or the amorphous W silicide film is formed on the TiN film. In semiconductor devices according to some embodiments of the present invention, the barrier film inserted between the polysilicon film and the metal film in a polymetal structure has a stacking structure in which the TiN film and the amorphous metal silicide film or the TiN film and the crystal Ti film are stacked. The TiN film secures thermal stability and, at the same time, the buffer layer provides a low wiring resistance by increasing the grain size of a metal film formed thereon. Therefore, semiconductor devices according to some embodiments of the present invention may provide thermal stability and low resistance wiring.

Figure 6:
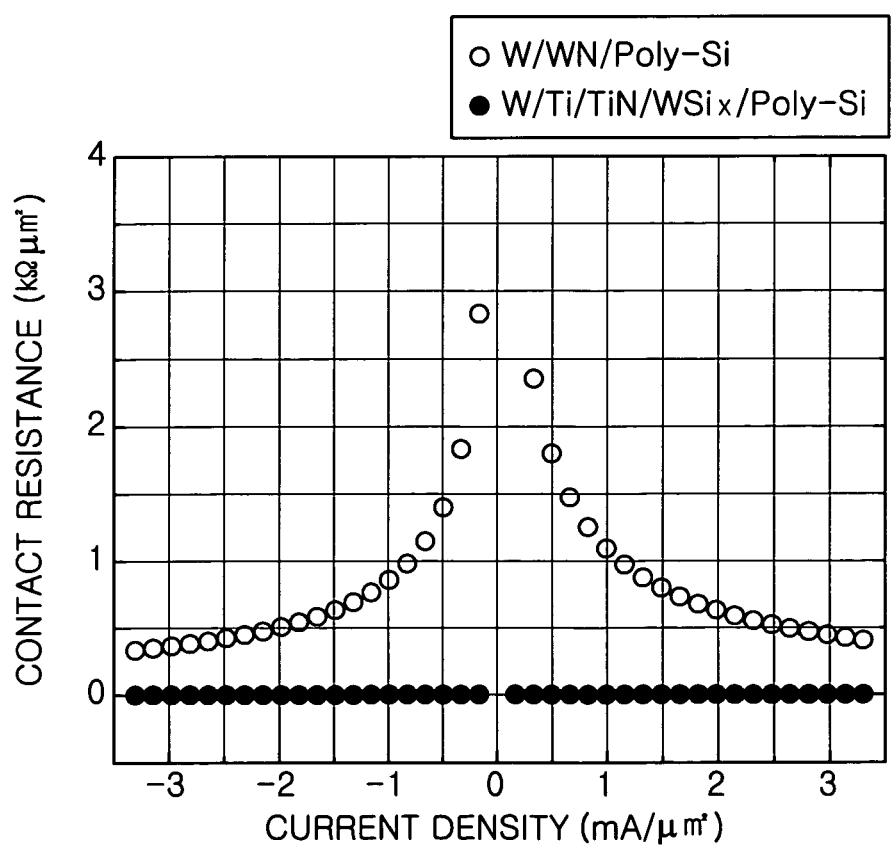
FIG. 6 is a graph illustrating contact resistance vs. current density for a metal film and a polysilicon film in polymetal gate structures according to some embodiments of the present invention.

Referring now to FIG. 6, a graph illustrating the variations of contact resistance between a metal film and a polysilicon film in polymetal gate structures according to the structure of a barrier film and the existence of tungsten silicide between the polysilicon film and the barrier film in accordance with some embodiments of the present invention will be discussed. To measure the contact resistance illustrated in FIG. 6, a polymetal gate structure indicated on the graph as "W/WN/Poly-Si" and a polymetal gate structure indicated on the graph as "W/Ti/TiN/WSix/Poly-Si" are formed. The polymetal gate structure indicated on the graph as W/WN/Poly-Si" includes a WN barrier film and a W film sequentially formed on a polysilicon film on a semiconductor substrate. The polymetal gate structure indicated on the graph as "W/Ti/TiN/WSix/Poly-Si" includes a barrier film, in which a W silicide film, a TiN film, and a Ti film are sequentially formed and a W film sequentially formed on a polysilicon film on a semiconductor substrate. The contact resistances between the W film and the polysilicon film of the polymetal gate structures are measured.

In the W/Ti/TiN/WSix/Poly-Si structure according to some embodiments of the present invention, an ohmic contact is formed between the W film and the polysilicon film by inserting a W silicide film under the Ti/TiN barrier film. Furthermore, nitridation and oxidation at an interface between the TiN film and the W silicide film may be limited by the Ti film deposited on the TiN film. Therefore, the contact resistance between the W film and the polysilicon film may be reduced by from about 3 to about 10 times or less than that of the conventional W/WN/Poly-Si structure.

Referring now to FIG. 7, a graph illustrating the variations of contact resistance between a metal film and a polysilicon film in a polymetal gate structure will be discussed as a comparative example. To measure the contact resistance illustrated in FIG. 7, a polymetal gate structure indicated on the graph as "W/WN/Poly-Si" and a polymetal gate structure indicated on the graph as "W/WN/WSix/Poly-Si" are formed. The polymetal gate structure indicated on the graph as "W/WN/Poly-Si" includes a WN barrier film and a W film sequentially formed on a polysilicon film on a semiconductor substrate. The polymetal gate structure indicated on the graph as "W/WN/WSix/Poly-Si" includes a W silicide film, a WN barrier film, and a W film sequentially formed on a polysilicon film on a semiconductor substrate. The contact resistances between the W film and the polysilicon film of the polymetal gate structures are measured.

As illustrated in FIG. 7, in the polymetal structure that uses the WN barrier film, an ohmic contact is not formed at the interface between the W film and the polysilicon film because the W silicide film inserted is nitridated by nitrogen N generated by the decomposition of the WN.

As illustrated by the experimental results, according to some embodiments of the present invention, the thermal stability of a gate stack structure may be improved by using a TiN film as a barrier film of a polymetal gate. Furthermore, word line resistance of the gate stack structure can be reduced by inserting a buffer layer between the metal layer and a TiN film used as a barrier film to increase the grain size of a metal film. Contact resistance between the metal film and the polysilicon film under the metal film can also be reduced by from about 3 to about 10 times or less than that of a conventional structure by inserting a metal silicide film between a polysilicon film and a barrier film. The performance of a highly integrated semiconductor device manufactured using 100 nm technology or less may be improved in accordance with some embodiments of the present invention as discussed herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor device comprising:
   a semiconductor substrate;
   a gate insulating film on the semiconductor substrate; and
   a polymetal gate electrode on the gate insulating film, the polymetal gate electrode including a conductive polysilicon film on the gate insulating film, a first metal silicide film on the conductive polysilicon film, a barrier film on the first metal silicide film, and a metal film on the barrier film and the barrier film including a titanium nitride (TiN) film on the first metal silicide film and a buffer layer between the TiN film and the metal film, wherein the barrier film comprises the TiN film and a Ti film.

2. The device of claim 1, wherein the first metal silicide film includes tungsten (W) silicide, molybdenum (Mo) silicide, titanium (Ti) silicide, tantalum (Ta) silicide, Hafflium (Hf) silicide or cobalt (Co) silicide.

3. The device of claim 1, wherein the buffer layer is includes at least one of titanium (Ti), tantalum (Ta), zirconium (Zr), hafflium (Hf) and/or silicon (Si).

4. The device of claim 1, wherein the buffer layer comprises an amorphous second metal silicide film.

5. The device of claim 4, wherein the second metal silicide film includes tungsten (W) silicide, molybdenum (Mo) silicide, titanium (Ti) suicide, tantalum (Ta) suicide, Haflaium (Hf) silicide or cobalt (Co) silicide.

6. A semiconductor device comprising:
   a semiconductor substrate;
   a gate insulating film on the semiconductor substrate; and
   a polymetal gate electrode on the gate insulating film, the polymetal gate electrode including a conductive polysilicon film on the gate insulating film, a first metal silicide film on the conductive polysilicon film, a barrier film on the first metal silicide film, and a metal film on the barrier film and the barrier film including a titanium nitride (TiN) film on the first metal silicide film and a buffer layer between the TiN film and the metal film, wherein the barrier film comprises the TiN film and an amorphous tungsten (W) silicide film.

7. A semiconductor device comprising:
   a semiconductor substrate;
   a gate insulating film on the semiconductor substrate; and
   a polymetal gate electrode on the gate insulating film, the polymetal gate electrode including a conductive polysilicon film on the gate insulating film, a first metal silicide film on the conductive polysilicon film, a barrier film on the first metal suicide film, and a metal film on the barrier film and the barrier film including a titanium nitride (TiN) film on the first metal silicide film and a buffer layer between the TiN film and the metal film, wherein the metal film includes tungsten (W) or molybdenum (Mo).

* * * * *